(12) United States Patent
Koike (10) Patent No.: US 8,456,618 B2
(45) Date of Patent: Jun. 4, 2013

(54) STAGE APPARATUS, EXPOSURE APPARATUS, AND METHOD OF MANUFACTURING DEVICE

(75) Inventor: Kana Koike, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 352 days.

(21) Appl. No.: 12/835,465

(22) Filed: Jul. 13, 2010

(65) Prior Publication Data

US 2011/0007297 A1 Jan. 13, 2011

(30) Foreign Application Priority Data

Jul. 13, 2009 (JP) .................................. 2009-165048

(51) Int. Cl.
*G03B 27/64* (2006.01)
(52) U.S. Cl.
USPC ........................................................ 355/76
(58) Field of Classification Search
USPC ...................................... 355/75, 76
See application file for complete search history.

(56) References Cited

U.S. PATENT DOCUMENTS

| 6,157,441 | A | * | 12/2000 | Ohlig | 355/91 |
| 7,307,698 | B2 | | 12/2007 | Miyajima et al. | |
| 2011/0007297 | A1 | * | 1/2011 | Koike | 355/76 |

FOREIGN PATENT DOCUMENTS

| JP | 2000-299370 A | 10/2000 |
| JP | 2005-235890 A | 9/2005 |

* cited by examiner

*Primary Examiner* — Thomas R Artman
(74) *Attorney, Agent, or Firm* — Rossi Kimms & McDowell LLP (57) ABSTRACT

A stage apparatus, which holds a plate member, comprises: a stage; a first positioning member and a second positioning member which are placed on the stage, and are configured to contact a lower surface and an upper surface of the plate member respectively to position the plate member in a direction perpendicular to a plane of the plate member; an elastic, first enclosing member configured to form a first enclosed space around the first positioning member; an elastic, second enclosing member configured to form a second enclosed space around the second positioning member; and a first suction mechanism and a second suction mechanism configured to respectively suck air from the first enclosed space and air from the second enclosed space so as to chuck the plate member to the first enclosed space and the second enclosed space by vacuum absorption.

8 Claims, 5 Drawing Sheets

STAGE APPARATUS, EXPOSURE APPARATUS, AND METHOD OF MANUFACTURING DEVICE

BACKGROUND OF THE INVENTION

1. Field of the Invention

The present invention relates to a stage apparatus, an exposure apparatus, and a method of manufacturing a device.

2. Description of the Related Art

In a conventional reticle stage of an exposure apparatus, only the non-patterned, limited portion of the lower surface of a reticle is chucked on a vacuum pad by vacuum absorption, so the vacuum pad often has an insufficient reticle absorption force. Thus, as the acceleration of the reticle stage is increased to improve the productivity, the reticle inertia force may exceed the reticle holding force (frictional force) by vacuum absorption, resulting in sliding between the reticle and the reticle stage. If the reticle position shifts upon such sliding, a serious problem that alignment may become impossible due to deterioration in alignment accuracy is posed. This limits the acceleration in scanning driving of the reticle stage, and therefore hampers an improvement in device productivity.

In order to solve such a problem, Japanese Patent Laid-Open No. 2000-299370 discloses an arrangement that holds a reticle by chucking its upper and lower surfaces by vacuum absorption.

Unfortunately, if a foreign substance adheres onto the upper or lower surface of the reticle, the following problem is posed. In projecting the pattern on the reticle surface onto a wafer, the precision of the pattern formed on the wafer deteriorates due to worsening of defocus within the pattern plane. Furthermore, the reticle may deform and warp upon clamping it due to the differences in flatness between the upper and lower surfaces of the reticle and the surfaces of members, which hold the reticle.

SUMMARY OF THE INVENTION

The present invention provides a stage apparatus that strongly holds a plate member such as a reticle, and does not cause warpage of the plate member even if a foreign substance adheres onto the upper or lower surface of the plate member or a member, which holds the plate member.

According to the present invention, there is provided a stage apparatus which holds a plate member, the apparatus comprising: a stage; a first positioning member which is placed on the stage, and is configured to contact a lower surface of the plate member to position the plate member in a direction perpendicular to a plane of the plate member; a second positioning member which is placed on the stage, and is configured to contact an upper surface of the plate member to position the plate member in the direction perpendicular to the plane of the plate member, together with the first positioning member; an elastic, first enclosing member configured to form a first enclosed space around the first positioning member; an elastic, second enclosing member configured to form a second enclosed space around the second positioning member; and a first suction mechanism and a second suction mechanism configured to respectively suck air from the first enclosed space and air from the second enclosed space so as to chuck the plate member to the first enclosed space and the second enclosed space by vacuum absorption.

Further features of the present invention will become apparent from the following description of exemplary embodiments with reference to the attached drawings.

DESCRIPTION OF THE EMBODIMENTS

[Exposure Apparatus]

Figure 1:
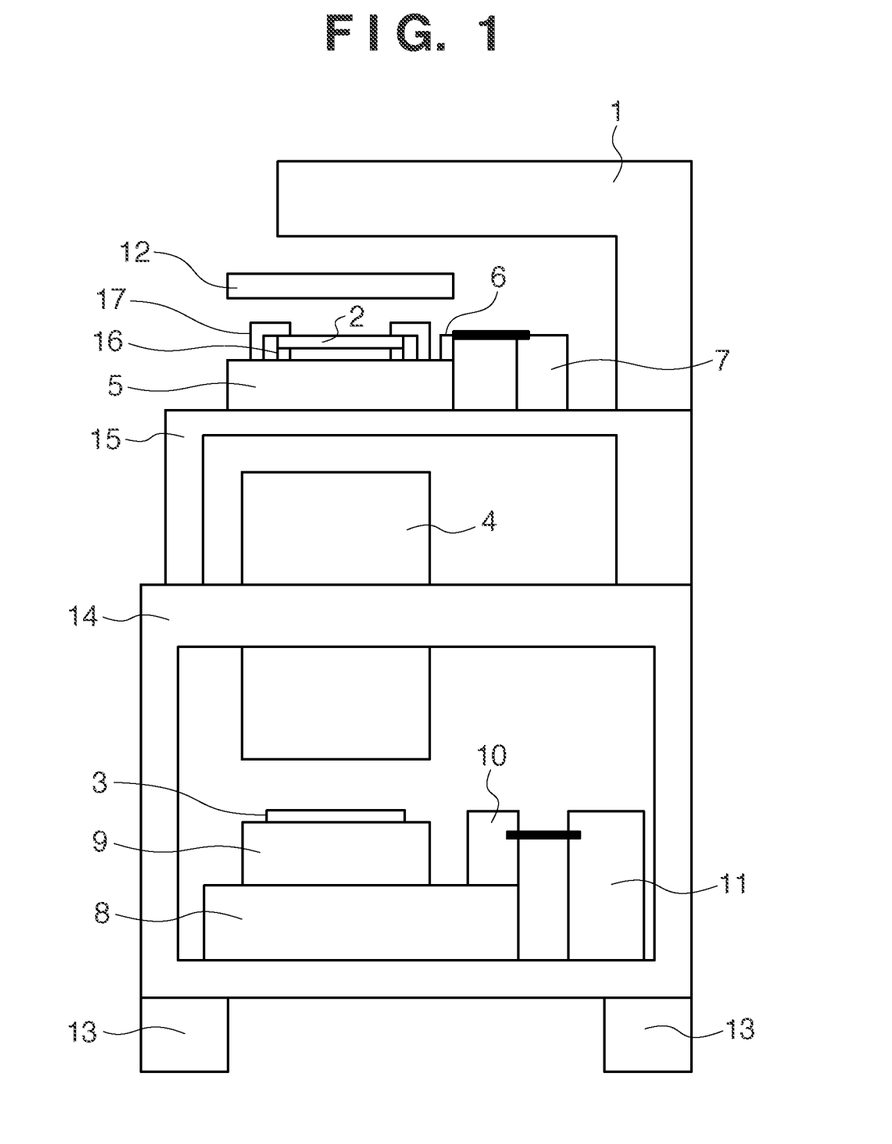
FIG. 1 is a view showing the schematic arrangement of an exposure apparatus.

FIG. 1 is a view showing the schematic arrangement of a scanning exposure apparatus. This exposure apparatus includes an illumination system 1 and projection optical system 4. The illumination system 1 converts exposure light from a mercury lamp or a laser light source serving as the light source used into a slit-like light beam. The projection optical system 4 reduces and projects the pattern of a reticle (original) 2 illuminated with the slit-like light beam onto a substrate (wafer) 3. A reticle holding mechanism included in a laterally movable reticle stage 5 chucks the reticle 2 by vacuum absorption. A reflecting mirror 6 is mounted on the reticle stage 5, and a laser interferometer 7 measures the position of the reticle stage 5 via the reflecting mirror 6. A substrate chuck (wafer chuck) 9 mounted on a substrate stage (wafer stage) 8 chucks the wafer 3 by vacuum absorption. A bar mirror 10 is mounted on the wafer stage 8, and a laser interferometer 11 measures the position of the wafer stage 8 via the bar mirror 10. An alignment detection system 12 for detecting the relative position between the reticle 2 and the wafer 3 is set at a position above the reticle 2. The exposure apparatus detects the relative position between the reticle 2 and the wafer 3 using the alignment detection system 12. After that, the exposure apparatus performs scanning exposure while synchronizing the positions of the reticle 2 and wafer 3 with each other using the laser interferometers 7 and 11 which measure the positions of the reticle stage 5 and wafer stage 8, respectively. The entire exposure apparatus is supported by a body frame 14 installed on an antivibration table 13, and the reticle stage 5 moves on a structure 15 attached on the body frame 14. The reticle 2 has a pattern formed on it. This pattern is projected onto the wafer 3 via the projection optical system 4 to expose it. Referring to FIG. 1, reference numerals 16 and 17 denote a lower holding mechanism and upper holding mechanism, respectively, of the holding mechanism that constitutes a reticle stage apparatus, which holds the reticle 2, together with the stage (reticle stage) 5.

A reticle stage apparatus, which holds a reticle according to the present invention, will be described below with reference to embodiments. In the following embodiments, the reticle exemplifies a plate member, and the reticle stage apparatus exemplifies a stage apparatus which holds the plate member.

[First Embodiment]

Figure 2:
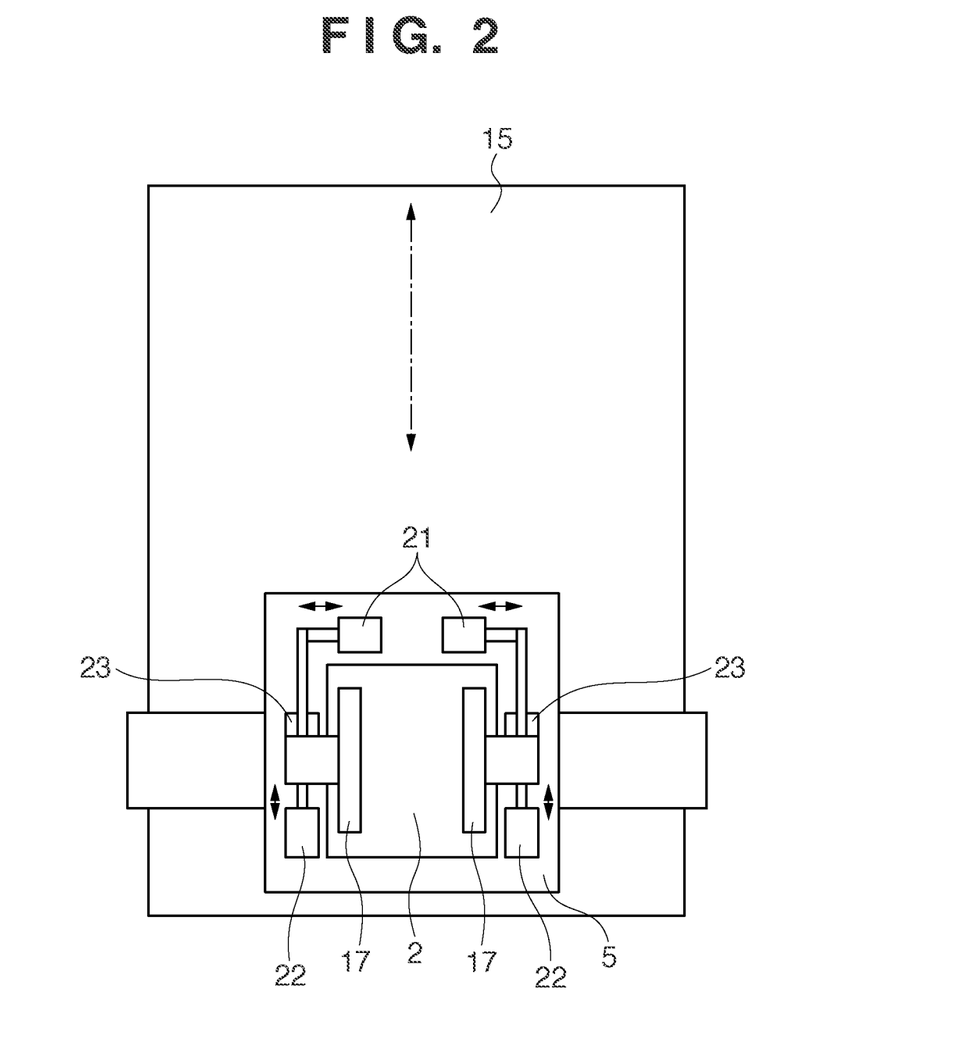
FIG. 2 is a plan view showing a reticle stage including a reticle holding mechanism according to the first embodiment.

FIG. 2 is a plan view showing a reticle stage apparatus in a scanning exposure apparatus including a reticle holding mechanism according to the first embodiment. Referring to FIG. 2, a stage (reticle stage) 5 holds a reticle 2. The reticle stage 5 is placed on a structure 15 serving as a fixing unit. The reticle stage 5 can move in a direction parallel to the plane of the reticle 2 (the vertical direction in FIG. 2).

Figure 3:
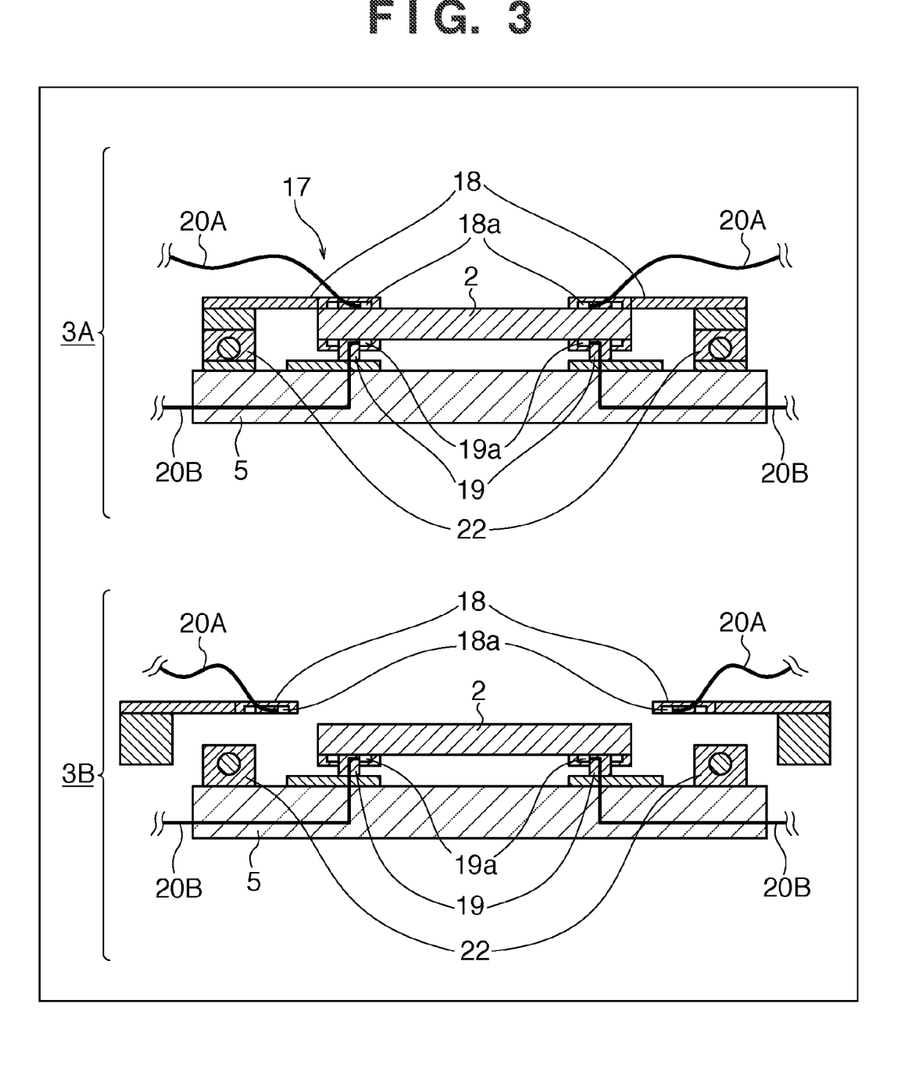
FIG. 3 is a sectional view showing the state in which the reticle holding mechanism shown in FIG. 2 holds a reticle, and that in which it releases the reticle.

3A of FIG. 3 is a sectional view showing the arrangement of the reticle stage apparatus, and the state in which an upper surface clamp 18 serving as an upper surface holding mechanism and a lower surface chuck 19 serving as a lower surface holding mechanism hold the reticle 2. The upper surface clamp 18 has a vacuum groove (second enclosed space) 18a formed in its surface which is in contact with the upper surface of the reticle 2, whereas the lower surface chuck 19 has a vacuum groove (first enclosed space) 19a formed in its surface which is in contact with the lower surface of the reticle 2. Vacuum spaces in the vacuum grooves 18a and 19a in the upper surface clamp 18 and lower surface chuck 19 can communicate with each other through suction tubes 20A and 20B which pass through their vicinities. These vacuum spaces can further communicate with a vacuum source through a vacuum valve controller outside the reticle stage 5 and the suction tubes 20A and 20B connected to this controller. The suction tubes 20A and 20B constitute parts of a first suction mechanism and second suction mechanism which respectively suck air from the vacuum groove 18a and air from the vacuum groove 19a so as to chuck the reticle 2 to the vacuum grooves 18a and 19a by vacuum absorption.

Assume that a foreign substance is adhering on the upper or lower surface of the reticle 2 when the upper surface clamp 18 and lower surface chuck 19 contact the upper and lower surfaces, respectively, of the reticle 2. In this case, the following problem is posed. In projecting the pattern of the reticle 2 onto a wafer 3, the precision of the pattern on the wafer 3 deteriorates due to worsening of defocus within the pattern plane. Furthermore, the surface of the reticle 2 may deform and warp upon clamping it due to the differences in flatness between the upper and lower surfaces of the reticle 2 and the surfaces of the upper surface clamp 18 and lower surface chuck 19.

In order to solve this problem, according to the present invention, the lower surface chuck 19 includes a positioning pin (first positioning member) 19B and thin elastic plate (first enclosing member) 19A. The positioning pin 19B serving as a first positioning member is fixed on the reticle stage 5, and contacts the lower surface of the reticle 2 to position the reticle 2 in a direction perpendicular to the plane of the reticle 2. The thin elastic plate 19A serving as a first enclosing member forms the first enclosed space (vacuum groove) 19a around the positioning pin 19B (see FIG. 4). A projection 19D is formed on the outer periphery of the thin elastic plate 19A, and its upper surface contacts the reticle 2. Also, a plurality of small-diameter pins 19E are inserted in the vacuum groove 19a at some portions, and their tops contact the reticle 2, as shown in 4B of FIG. 4. Similarly, the upper surface clamp 18 includes a positioning pin (second positioning member) 18B and thin elastic plate (second enclosing member) 18A. The positioning pin 18B is placed on the reticle stage 5, and contacts the upper surface of the reticle 2 to position the reticle 2 in a direction perpendicular to the plane of the reticle 2. The thin elastic plate 18A serving as a second enclosing member forms the second enclosed space (vacuum groove) 18a around the positioning pin 18B. A projection 18D is formed on the outer periphery of the upper surface clamp 18A, and its lower surface contacts the reticle 2. Also, a plurality of small-diameter pins 18E are inserted in the vacuum groove 18a at some portions, and their tops contact the reticle 2, as shown in 4B of FIG. 4.

The suction tubes 20A and 20B are connected to the contact surfaces between the reticle 2 and the upper surface clamp 18 and lower surface chuck 19, respectively. Activating the suction tubes 20A and 20B makes it possible to form vacuum spaces in the vacuum grooves 18a and 19a, respectively, thereby chucking the reticle 2 by vacuum absorption. Japanese Patent Laid-Open No. 2005-235890 describes details of a member like the thin elastic plate 19A.

Figure 4:
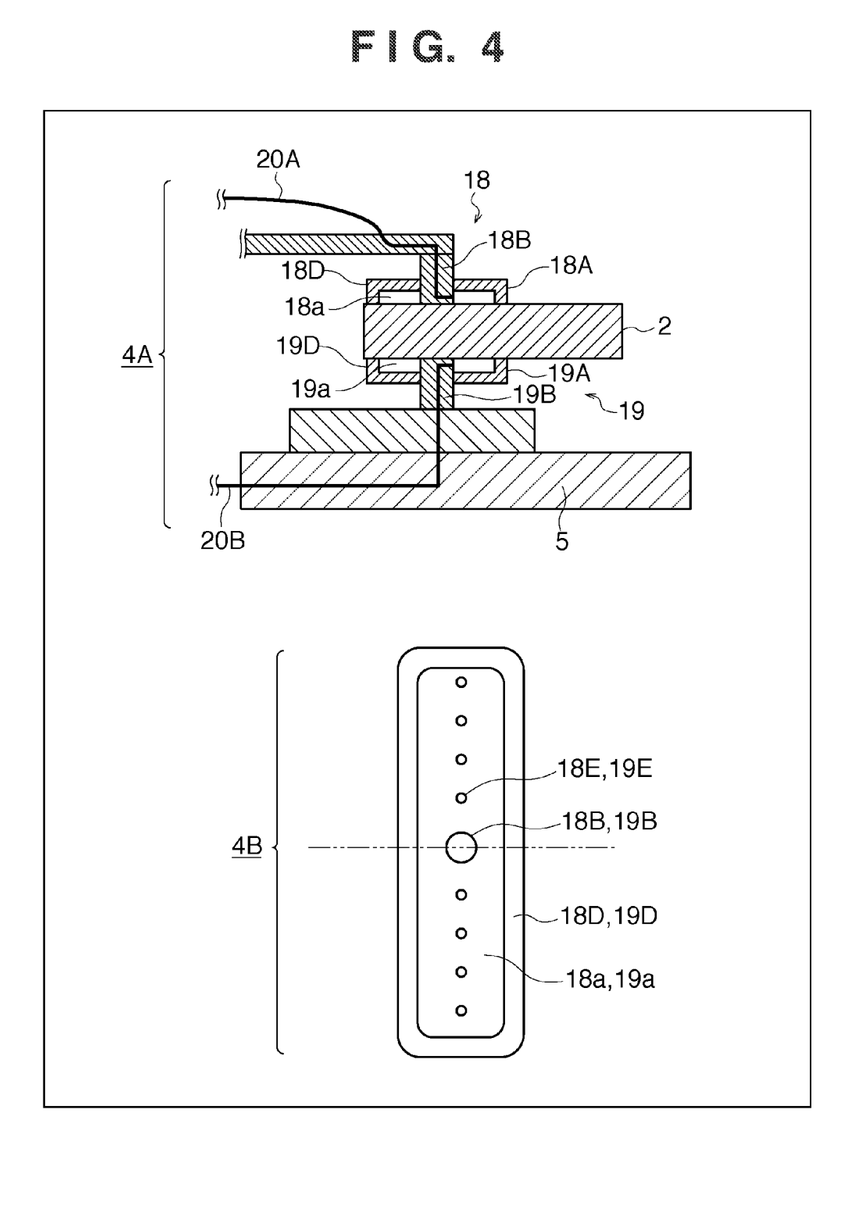
FIG. 4 is a enlarged view of the reticle holding mechanism shown in FIG. 3.

In the above-mentioned arrangement, since the plurality of thin elastic plates 18A and 19A contact the reticle 2 so as to fit with the shape of its edge, it is possible to suppress the occurrence of warpage in the reticle 2 upon clamping it. At the same time, since the small-diameter pins 18E and 19E onto which no foreign substances can adhere are inserted in the vacuum grooves 18a and 19a, respectively, at pluralities of portions, it is possible to prevent any foreign substances from adhering onto the contact surfaces with the reticle 2, thus suppressing the occurrence of warpage due to the adhesion of foreign substances.

A moving mechanism which moves the upper surface clamp 18 from the position (active position) where it faces the upper surface of the reticle 2 to that (retreat position) where it does not face that upper surface will be explained next. To exchange the reticle 2, the upper surface clamp 18 needs to retreat to the position where it does not face the upper surface of the reticle 2. FIG. 2 is a plan view showing the moving mechanism for the upper surface clamp 18, 3A of FIG. 3 is a sectional view showing the state in which the upper surface clamp 18 holds the reticle 2 by absorption, and 3B of FIG. 3 is a sectional view showing the state in which the upper surface clamp 18 retreats. Referring to FIG. 2, the upper surface clamp 18 can be moved in a direction parallel to the plane of the reticle 2 (the horizontal direction in FIG. 2) by a driving unit 21 (for example, an air cylinder). After the upper surface clamp 18 retreats from the upper surface of the reticle 2, as shown in 3B of FIG. 3, a reticle conveyance mechanism accesses the reticle 2 from the upper position or from the direction perpendicularly going into or coming out of the paper surface in 3B of FIG. 3 to recover the reticle 2. For this reason, the upper surface clamp 18 has a backlash large enough to allow the reticle 2 to move in it. However, if the upper surface clamp 18 moves in the direction to move the reticle stage 5 while clamping the reticle 2, a reticle shift occurs, and this deteriorates the pattern projected onto the wafer 3. To prevent this, it is necessary to use a third positioning member which positions the upper surface clamp 18 at the active position where it faces the upper surface of the reticle 2. After the upper surface clamp 18 moves to the position where it absorbs the reticle 2 by the driving unit 21, it abuts against a stopper 23 fixed on the reticle stage 5 by a fixing device 22 such as an air cylinder, thereby being positioned at the active position. The fixing device 22 and stopper 23 constitute a third positioning member which positions the upper surface clamp 18 at the active position. The fixing device 22 acts to prevent a relative displacement between the upper surface clamp 18 and the lower surface chuck 19 which absorbs the lower surface of the reticle 2. In this way, the reticle holding mechanism functions as a rigid body in the direction to move the reticle stage 5.

[Second Embodiment]

Figure 5:
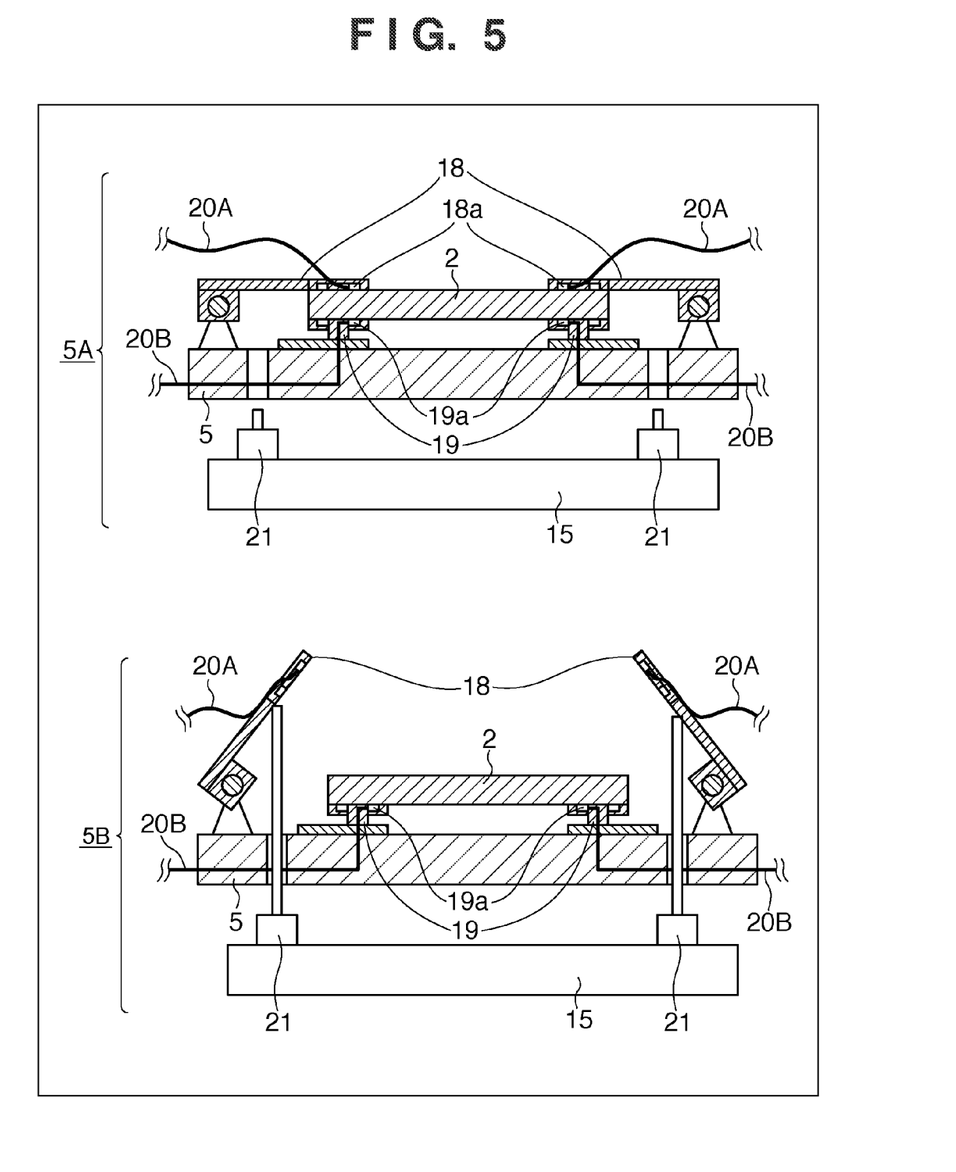
FIG. 5 is a sectional view showing the state in which a reticle holding mechanism according to the second embodiment holds a reticle, and that in which it releases the reticle.

FIG. 5 show an embodiment of another moving mechanism for an upper surface clamp 18. 5A of FIG. 5 is a sectional view showing the state in which the upper surface clamp 18 holds a reticle 2 by absorption. 5B of FIG. 5 is a sectional view showing the state in which the upper surface clamp 18 retreats and the reticle 2 is recovered. In the second embodiment, a driving unit 21 (for example, an air cylinder) is disposed on a structure 15 serving as a fixing unit. The driving unit 21 lifts the upper surface clamp 18 from the lower position to rotate it, thereby moving it from the active position to the retreat position. After the upper surface clamp 18 retreats from the upper surface of the reticle 2, a reticle loading/unloading mechanism accesses the reticle 2 from the upper position or from the direction going into or coming out of the paper surface in 5B of FIG. 5 to recover the reticle 2. At this time, because the driving unit 21 for the upper surface clamp 18 is not present near the reticle 2, it is not adversely affected by heat or vibration.

In the first and second embodiments, the driving unit 21 for the upper surface clamp 18 is separately disposed on the reticle stage 5 or structure 15. However, a reticle loading/unloading mechanism (not shown) also can move the upper surface clamp 18.

[Method of Manufacturing Device]

An embodiment of a method of manufacturing a device using the above-mentioned exposure apparatus will be described next. The device is manufactured by a step of exposing a substrate coated with a photosensitive agent using the exposure apparatus according to the above-described first or second embodiment, a step of developing the substrate exposed in the exposing step, and subsequent known steps. The device can be, for example, a semiconductor integrated circuit device or a liquid crystal display device. The substrate can be, for example, a wafer or a glass plate. The subsequent known steps include, for example, oxidation, film formation, vapor deposition, doping, planarization, etching, resist removal, dicing, bonding, and packaging steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-165048, filed Jul. 13, 2009, which is hereby incorporated by reference herein in its entirety.

What is claimed is:

1. A stage apparatus which holds a plate member, the apparatus comprising:
   a stage;
   a first positioning member which is placed on said stage, and is configured to contact a lower surface of the plate member to position the plate member in a direction perpendicular to a plane of the plate member;
   a second positioning member which is placed on said stage, and is configured to contact an upper surface of the plate member to position the plate member in the direction perpendicular to the plane of the plate member, together with said first positioning member;
   an elastic, first enclosing member configured to form a first enclosed space around said first positioning member;
   an elastic, second enclosing member configured to form a second enclosed space around said second positioning member;
   a first suction mechanism and a second suction mechanism configured to respectively suck air from the first enclosed space and air from the second enclosed space so that the plate member is chucked by vacuum absorption;
   a driving unit configured to move said second positioning member and said second enclosing member from a position where said second positioning member and said second enclosing member face the upper surface of the plate member to a position where said second positioning member and said second enclosing member do not face the upper surface; and
   a third positioning member configured to position said second positioning member and said second enclosing member at the position where said second positioning member and said second enclosing member face the upper surface of the plate member,
   wherein said driving unit moves said second positioning member and said second enclosing member in a direction parallel to the plane of the plate member between the position where said second positioning member and said second enclosing member face the upper surface of the plate member and the position where said second positioning member and said second enclosing member do not face the upper surface.

2. A stage apparatus which holds a plate member, the apparatus comprising:
   a stage;
   a first positioning member which is placed on said stage, and is configured to contact a lower surface of the plate member to position the plate member in a direction perpendicular to a plane of the plate member;
   a second positioning member which is placed on said stage, and is configured to contact an upper surface of the plate member to position the plate member in the direction perpendicular to the plane of the plate member, together with said first positioning member;
   an elastic, first enclosing member configured to form a first enclosed space around said first positioning member;
   an elastic, second enclosing member configured to form a second enclosed space around said second positioning member;
   a first suction mechanism and a second suction mechanism configured to respectively suck air from the first enclosed space and air from the second enclosed space so that the plate member is chucked by vacuum absorption; and
   a driving unit configured to move said second positioning member and said second enclosing member from a position where said second positioning member and said second enclosing member face the upper surface of the plate member to a position where said second positioning member and said second enclosing member do not face the upper surface,
   wherein said second positioning member and said second enclosing member are configured to rotate so as to move from the position where said second positioning member and said second enclosing member face the upper surface of the plate member to the position where said second positioning member and said second enclosing member do not face the upper surface, and
   wherein said driving unit lifts said second positioning member and said second enclosing member from a lower position to rotate said second positioning member and said second enclosing member.

3. An exposure apparatus which projects a pattern of a reticle onto a substrate to expose the substrate,
   the reticle being held by a stage apparatus,
   wherein the stage apparatus comprises
   a stage,
   a first positioning member which is placed on the stage, and is configured to contact a lower surface of the reticle to position the reticle in a direction perpendicular to a plane of the reticle,
   a second positioning member which is placed on the stage, and is configured to contact an upper surface of the reticle to position the reticle in the direction perpendicular to the plane of the reticle, together with the first positioning member, an elastic, first enclosing member configured to form a first enclosed space around the first positioning member, an elastic, second enclosing member configured to form a second enclosed space around the second positioning member, a first suction mechanism and a second suction mechanism configured to respectively suck air from the first enclosed space and air from the second enclosed space so that the reticle is chucked by vacuum absorption, a driving unit configured to move said second positioning member and said second enclosing member from a position where said second positioning member and said second enclosing member face the upper surface of the plate member to a position where said second positioning member and said second enclosing member do not face the upper surface, and a third positioning member configured to position said second positioning member and said second enclosing member at the position where said second positioning member and said second enclosing member face the upper surface of the plate member, wherein said driving unit moves said second positioning member and said second enclosing member in a direction parallel to the plane of the plate member between the position where said second positioning member and said second enclosing member face the upper surface of the plate member and the position where said second positioning member and said second enclosing member do not face the upper surface.

4. A method of manufacturing a device, the method comprising:

exposing a substrate to light by using an exposure apparatus;

developing the exposed substrate; and processing the developed substrate to manufacture the device, wherein the exposure apparatus projects a pattern of a reticle held by a stage apparatus onto a substrate to expose the substrate, and the stage apparatus comprises a stage, a first positioning member which is placed on the stage, and is configured to contact a lower surface of the reticle to position the reticle in a direction perpendicular to a plane of the reticle, a second positioning member which is placed on the stage, and is configured to contact an upper surface of the reticle to position the reticle in the direction perpendicular to the plane of the reticle, together with the first positioning member, an elastic, first enclosing member configured to form a first enclosed space around the first positioning member, an elastic, second enclosing member configured to form a second enclosed space around the second positioning member, a first suction mechanism and a second suction mechanism configured to respectively suck air from the first enclosed space and air from the second enclosed space so that the reticle is chucked by vacuum absorption, a driving unit configured to move said second positioning member and said second enclosing member from a position where said second positioning member and said second enclosing member face the upper surface of the plate member to a position where said second positioning member and said second enclosing member do not face the upper surface, and a third positioning member configured to position said second positioning member and said second enclosing member at the position where said second positioning member and said second enclosing member face the upper surface of the plate member, wherein said driving unit moves said second positioning member and said second enclosing member in a direction parallel to the plane of the plate member between the position where said second positioning member and said second enclosing member face the upper surface of the plate member and the position where said second positioning member and said second enclosing member do not face the upper surface.

5. A stage apparatus which holds a plate member, the apparatus comprising:

a stage;

a first positioning member which is placed on said stage, and is configured to contact a lower surface of the plate member to position the plate member in a direction perpendicular to a plane of the plate member;

an elastic, first enclosing member configured to form a first enclosed space around said first positioning member;

an elastic, second enclosing member which is placed on said stage, and is configured to contact an upper surface of the plate member to form a second enclosed space;

a first suction mechanism and a second suction mechanism configured to respectively suck air from the first enclosed space and air from the second enclosed space so that the plate member is chucked by vacuum absorption;

a driving unit configured to move said second enclosing member from a position where said second enclosing member face the upper surface of the plate member to a position where said second enclosing member do not face the upper surface; and a stopper configured to position said second enclosing member at the position where said second enclosing member faces the upper surface of the plate member, wherein said driving unit moves said second enclosing member in a direction parallel to the plane of the plate member between the position where said second enclosing member faces the upper surface of the plate member and the position where said second enclosing member does not face the upper surface.

6. An exposure apparatus which projects a pattern of a reticle onto a substrate to expose the substrate, the reticle being held by a stage apparatus, wherein the stage apparatus comprises a stage, a first positioning member which is placed on the stage, and is configured to contact a lower surface of the reticle to position the reticle in a direction perpendicular to a plane of the reticle, a second positioning member which is placed on the stage, and is configured to contact an upper surface of the reticle to position the reticle in the direction perpendicular to the plane of the reticle, together with the first positioning member, an elastic, first enclosing member configured to form a first enclosed space around the first positioning member, an elastic, second enclosing member configured to form a second enclosed space around the second positioning member, a first suction mechanism and a second suction mechanism configured to respectively suck air from the first enclosed space and air from the second enclosed space so that the reticle is chucked by vacuum absorption, a driving unit configured to move said second positioning member and said second enclosing member from a position where said second positioning member and said second enclosing member face the upper surface of the plate member to a position where said second positioning member and said second enclosing member do not face the upper surface, wherein said second positioning member and said second enclosing member are configured to rotate so as to move from the position where said second positioning member and said second enclosing member face the upper surface of the plate member to the position where said second positioning member and said second enclosing member do not face the upper surface, and wherein said driving unit lifts said second positioning member and said second enclosing member from a lower position to rotate said second positioning member and said second enclosing member.

7. A method of manufacturing a device, the method comprising:

exposing a substrate to light by using an exposure apparatus;

developing the exposed substrate; and processing the developed substrate to manufacture the device, wherein the exposure apparatus projects a pattern of a reticle held by a stage apparatus onto a substrate to expose the substrate, and the stage apparatus comprises a stage, a first positioning member which is placed on the stage, and is configured to contact a lower surface of the reticle to position the reticle in a direction perpendicular to a plane of the reticle, a second positioning member which is placed on the stage, and is configured to contact an upper surface of the reticle to position the reticle in the direction perpendicular to the plane of the reticle, together with the first positioning member, an elastic, first enclosing member configured to form a first enclosed space around the first positioning member, an elastic, second enclosing member configured to form a second enclosed space around the second positioning member, a first suction mechanism and a second suction mechanism configured to respectively suck air from the first enclosed space and air from the second enclosed space so that the reticle is chucked by vacuum absorption, a driving unit configured to move said second positioning member and said second enclosing member from a position where said second positioning member and said second enclosing member face the upper surface of the plate member to a position where said second positioning member and said second enclosing member do not face the upper surface, wherein said second positioning member and said second enclosing member are configured to rotate so as to move from the position where said second positioning member and said second enclosing member face the upper surface of the plate member to the position where said second positioning member and said second enclosing member do not face the upper surface, and wherein said driving unit lifts said second positioning member and said second enclosing member from a lower position to rotate said second positioning member and said second enclosing member.

8. A stage apparatus which holds a plate member, the apparatus comprising:

a stage;

a first positioning member which is placed on said stage, and is configured to contact a lower surface of the plate member to position the plate member in a direction perpendicular to a plane of the plate member;

an elastic, first enclosing member configured to form a first enclosed space around said first positioning member;

an elastic, second enclosing member which is placed on said stage, and is configured to contact an upper surface of the plate member to form a second enclosed space;

a first suction mechanism and a second suction mechanism configured to respectively suck air from the first enclosed space and air from the second enclosed space so that the plate member is chucked by vacuum absorption;

a driving unit configured to move said second enclosing member from a position where said second enclosing member face the upper surface of the plate member to a position where said second enclosing member do not face the upper surface; and a stopper configured to position said second enclosing member at the position where said second enclosing member faces the upper surface of the plate member, wherein said second enclosing member is configured to rotate so as to move from the position where said second enclosing member faces the upper surface of the plate member to the position where said second enclosing member does not face the upper surface, and said driving unit lifts said second enclosing member from a lower position to rotate said second enclosing member.

* * * * *